(12) United States Patent
Lee

(10) Patent No.: US 7,920,420 B2
(45) Date of Patent: *Apr. 5, 2011

(54) MULTI BIT FLASH MEMORY DEVICE AND METHOD OF PROGRAMMING THE SAME

(75) Inventor: Seung-Jae Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 486 days.

This patent is subject to a terminal disclaimer.

(21) Appl. No.: 12/000,209

(22) Filed: Dec. 11, 2007

(65) Prior Publication Data

US 2008/0137416 A1 Jun. 12, 2008

(30) Foreign Application Priority Data

Dec. 11, 2006 (KR) .................. 10-2006-0125731

(51) Int. Cl.
*G11C 16/04* (2006.01)
(52) U.S. Cl. .......... 365/185.03; 365/185.22; 365/185.28
(58) Field of Classification Search ............. 365/185.03, 365/185.22, 185.28
See application file for complete search history.

(56) References Cited

U.S. PATENT DOCUMENTS

| 5,768,188 | A | 6/1998 | Park et al. | |
|---|---|---|---|---|
| 6,046,935 | A * | 4/2000 | Takeuchi et al. | 365/185.03 |
| 6,097,637 | A | 8/2000 | Bauer et al. | |
| 6,233,174 | B1 | 5/2001 | Tsujikawa et al. | |
| 6,493,269 | B1 | 12/2002 | Cernea | |
| 6,738,289 | B2 | 5/2004 | Gongwer et al. | |
| 7,054,193 | B1 | 5/2006 | Wong | |
| 7,602,650 | B2 * | 10/2009 | Jung et al. | 365/185.22 |
| 2007/0016722 | A1 | 1/2007 | Lee et al. | |
| 2007/0030732 | A1 * | 2/2007 | Micheloni et al. | 365/185.03 |
| 2007/0109854 | A1 * | 5/2007 | Shibata | 365/185.08 |

FOREIGN PATENT DOCUMENTS

KR 1020020060502 7/2002

* cited by examiner

*Primary Examiner* — Hoai V Ho
(74) *Attorney, Agent, or Firm* — Harness, Dickey & Pierce, P.L.C.

(57) ABSTRACT

A method of programming a flash memory device may include dividing a plurality of memory cells into a plurality of groups according to a threshold voltage state, the memory cells configured to store multi bit data. The plurality of memory cells may be programmed with a program data. The memory cells of the divided groups may be respectively selected and programmed by divided group during the programming of the plurality of memory cells.

21 Claims, 11 Drawing Sheets

MULTI BIT FLASH MEMORY DEVICE AND METHOD OF PROGRAMMING THE SAME

PRIORITY STATEMENT

This U.S. non-provisional patent application claims the benefit of priority under 35 U.S.C. §119 to Korean Patent Application No. 10-2006-0125731, filed on Dec. 11, 2006, the entire contents of which are hereby incorporated in their entirety by reference.

BACKGROUND

1. Field

Example embodiments relate to a semiconductor memory device, and for example, to a multi bit flash memory device and/or a method of programming the same.

2. Description of Related Art

Semiconductor memory devices are largely classified into volatile semiconductor memory devices and non-volatile semiconductor memory devices. The volatile semiconductor memory devices have faster reading and writing speeds, but stored contents of the volatile semiconductor memory devices disappear if no external power is applied. On the other hand, the non-volatile semiconductor memory devices retain stored contents even if there is no power supply. Therefore, the non-volatile semiconductor memory devices are used to store contents, which must remain regardless of power supply. Examples of the non-volatile semiconductor memory devices are a mask read-only memory (MROM), a programmable read-only memory (PROM), an erasable programmable read-only memory (EPROM), and an electrically erasable programmable read-only memory (EEPROM).

Because erase and write operations are relatively difficult in the MROM, PROM, and EPROM, common users may not be able to update memory contents. However, because erase and write operations may be electrically done in the EEPROM, the EEPROM is more widely used in system programming or auxiliary memory devices, which require continuous updating. A flash EEPROM has a higher degree of integration compared to a typical EEPROM, and the flash EEPROM may be more advantageous for a high-capacity auxiliary memory device. Among the flash EEPROM, a NAND-type flash EEPROM (hereinafter, referred to as a NAND flash memory) has a remarkably higher degree of integration, compared to other flash EEPROMs.

Recently, as the demand for a higher degree of integration in a memory device increases, multi bit memory devices that store multi bit data in one memory cell are used.

If 1-bit data is stored in each memory cell, each memory cell has one of two threshold voltage distributions, one of which corresponds to data 1 or data 0. On the other hand, if 2-bit data is stored in each memory cell, each memory cell has one of four threshold voltage distributions. If 3-bit data is stored in each memory cell, each memory cell has one of eight threshold voltage distributions. Recently, various technologies for storing 4-bit data in one memory cell are under active development.

FIG. 1 is a view of conventional processes of programming multi bit data by a page unit according to a binary ordering method. To store 4-bit data in one memory cell, the 4-bit data is programmed by a page unit. After programming a first page Page 1, memory cells respectively have a threshold voltage state corresponding to 1 or 0. After programming a second page Page 2, the memory cells respectively have a threshold voltage state corresponding to 11, 01, 10, and 00. After programming a third page Page 3, the memory cells respectively have a threshold voltage state corresponding to 111, 011, 101, 001, 110, 010, 100, and 000. A verify operation performed after programming a fourth page Page 4 (or, an MSB page) includes a preliminary read operation and a verify read operation. In the preliminary read operation, first read voltages 10 are provided to a word line of the selected memory cells. In the verify read operation, second read voltages 20 are applied to the word line of selected memory cells. After applying a program voltage, if a threshold voltage of a cell, whose MSB page is 0, is determined to exist between a first read voltage VpreX and a second read voltage VfyX, the memory cell is determined as a verify pass. The memory cells determined as verify pass become program inhibit in a program loop.

FIG. 2 is an example timing diagram of a program operation according to the sequence in FIG. 1. Referring to FIG. 2, after a program execution operation, a preliminary read operation Pre RD sensing a threshold voltage state, and a verify read operation Verify are respectively performed on all threshold voltage states. A second loop for reprogramming is performed on cells, which are determined as fail during a first loop. In each loop, preliminary read pre RD and verify read Verify operations are performed as in the first loop. The preliminary read pre RD and verify read Verify operations repeat until all the selected memory cells become pass.

FIG. 3 is a view of conventional processes of programming multi bit data by a page unit according to a gray ordering method. After programming a first page Page 1, each memory cell has a threshold voltage state corresponding to 1 or 0. After programming a second page Page 2, each memory cell has a threshold voltage state corresponding to 11, 10, 00, and 01. After programming a third page Page 3, each memory cell has a threshold voltage state corresponding to 111, 110, 100, 101, 001, 000, 010, and 011. A preliminary read operation is performed by first read voltages 30 to read program states up to the three pages, in order to perform a program operation on a fourth page Page 4 (or, an MSB page). According to the result of the preliminary read operation, cells where data of the fourth page to be programmed is 1, become program inhibit. According to the program inhibit, cells, where data of the fourth page Page 4 is 1, maintain a threshold voltage state at the time if the third page Page 3 is programmed. Among the cells selected by the preliminary read operation, cells, where data of the fourth page Page 4 to be programmed is 0, are programmed with a threshold voltage corresponding to 0. After applying a program voltage (e.g., an ISPP voltage) to the selected memory cells once, a verify read operation that determines if the memory cells are programmed or not is performed by second read voltages 40. The memory cells determined as verify pass through the verify read operation become program inhibit, and the memory cells determined as fail are set to be reprogrammed.

FIG. 4 is an example timing diagram of a program operation according to the sequence in FIG. 3. Referring to FIG. 4, before programming a fourth page Page 4, a preliminary read Pre RD operation is performed on the program result of the previous third page Page 3. The memory cells selected by the preliminary read operation are programmed to a target threshold voltage state by applying a program voltage Vpgm to a word line during a program execution interval. A verify operation is performed during a verify interval in order to determine if each memory cell is programmed or not. During the verify interval, the threshold voltage state of each memory cell is read by second read voltages Vfy1 to Vfy8. A second program loop for reprogramming is performed on the cells that are determined as fail in the first program loop. The second program loop is performed on the cells that are determined as fail by the verify read operation. The program execution operation and verify operation repeat until all the selected memory cells become pass.

According to the above description with reference to the drawings, program executions of a fourth page Page 4 (or, an MSB page) are simultaneously performed on the all the selected memory cells. The selected memory cells have a same level of program voltage during the program execution. In the above programming method, at least four latches in a page buffer are required to perform a preliminary read operation, and a time for programming multi bit data increases.

SUMMARY

Example embodiments provide a method of reducing the number of latches in a page buffer which is used for programming multi bit data.

Example embodiments provide a method of reducing a time for programming multi bit data.

According to an example embodiment, a method of programming a flash memory device may include dividing a plurality of memory cells into a plurality of groups according to a threshold voltage state, the memory cells configured to store multi bit data. The plurality of memory cells may be programmed with a program data. The memory cells of the divided groups may be respectively selected and programmed by divided group during the programming of the plurality of memory cells.

According to an example embodiment, the plurality of memory cells may be flash memory cells configured to store 4-bit data corresponding to first through fourth pages.

According to an example embodiment, the program data may be fourth page data.

According to an example embodiment, each group of the plurality of groups may include memory cells with one threshold voltage state.

According to an example embodiment, each group of the plurality of groups may include memory cells with at least two different threshold voltage states.

According to an example embodiment, programming the plurality of memory cells with the program data may include selecting the memory cells of a selected group, applying the program data to a bit line of the selected memory cells and a program voltage to a word line of the plurality of memory cells, and/or verifying if the selected memory cells are programmed.

According to an example embodiment, the plurality of memory cells except for the selected memory cells may be program inhibit during the programming the plurality of memory cells with the program data.

According to an example embodiment, the applying and verifying steps may constitute one program loop, and/or the one program loop may repeat until all of the selected memory cells of the selected group are programmed to target threshold voltage states.

According to an example embodiment, the selecting step may include selecting and programming memory cells of a higher threshold voltage before programming memory cells of a lower threshold voltage.

According to an example embodiment, the plurality of groups may be respectively programmed with different program start voltages.

According to an example embodiment, a program start voltage of a group with a relatively higher threshold voltage state may be higher than a program start voltage of a group with a lower threshold voltage state.

According to an example embodiment, verifying if the selected memory cells are programmed may include detecting if threshold voltages of the selected memory cells exist in a range between an upper limit and a lower limit of a target threshold voltage state.

According to an example embodiment, the detecting if the threshold voltages of the selected memory cells exist in the range between the upper limit and the lower limit of the target threshold voltage state may be performed on each of the threshold voltage states in the group.

According to an example embodiment, programming the plurality of memory cells with the program data may include selecting the memory cells of a selected group, performing a first read operation to read a threshold voltage state of the selected memory cells, applying a program voltage to a word line of the selected memory cells, and/or verifying if the memory cells of the selected group are programmed.

According to an example embodiment, the plurality of memory cells except for the selected memory cells may be program inhibit during the programming the plurality of memory cells with the program data.

According to an example embodiment, the performing the first read operation may include detecting if a threshold voltage of the selected memory cells is included in one of the at least two threshold voltage states and storing the detected result as data.

According to an example embodiment, the first read operation may be performed once if the number of threshold voltage states in the selected group is two.

According to an example embodiment, if the number of threshold voltage states in the selected group is two, the verifying if the memory cells of the selected group are programmed may include performing a verify read operation twice with respectively different verify voltages on another two threshold voltage states programmed from the two threshold voltage states.

According to an example embodiment, if the number of threshold voltage states in the selected group is four, the first read operation may be performed three times.

According to an example embodiment, the applying and the verifying steps may repeat until all of the selected memory cells of the selected group are programmed to target threshold voltage states.

According to an example embodiment, the program data may be a most significant bit (MSB) page data of the multi bit data.

According to an example embodiment a flash memory device may include a cell array, a page buffer block, and/or a control logic. The cell array may include a plurality of memory cells, and/or the memory cells may be connected to the same word line and may be configured to store multi bit data. The page buffer block may be connected to bit lines of the plurality of memory cells and may be configured to perform read and program operations on the memory cells. The control logic may be configured to divide the plurality of memory cells into a plurality of groups according to a threshold voltage state and/or may be configured to control the page buffer block to program the memory cells by divided group to program one page data of the multi bit data.

According to an example embodiment, the page buffer block may include a plurality of page buffers, the page buffers electrically connected to the bit lines of the memory cells.

According to an example embodiment, the control logic may be configured to control the page buffer block to deliver program data to the bit lines of a selected group for programming during the program operation.

According to an example embodiment, the control logic may be configured to control the page buffer block to provide a bit line voltage for program inhibit to the bit lines except for the bit lines corresponding to the selected group during the program operation.

According to an example embodiment, the control logic may be configured to control a program voltage applied to the word line during the program operation.

According to an example embodiment, the control logic may be configured to provide first and second read voltages to the word line in order to perform a verify operation after applying the program voltage during the program operation.

According to an example embodiment, the control logic may be configured to control the page buffer block to perform a preliminary read operation according to the first read voltage to read a threshold voltage state of the memory cells of the selected group during the program operation.

According to an example embodiment, a program voltage may be applied to the word line to program data into the memory cells after the preliminary read operation during the program operation, the data provided from a page buffer corresponding to the selected group.

According to an example embodiment, the page buffer block may be controlled in order to perform a verify read operation according to the second read voltages after applying the program voltage during the program operation.

According to an example embodiment, the flash memory device may include a voltage generator configured to provide the program voltage and the first and second read voltages to the word line according to a control of the control logic.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
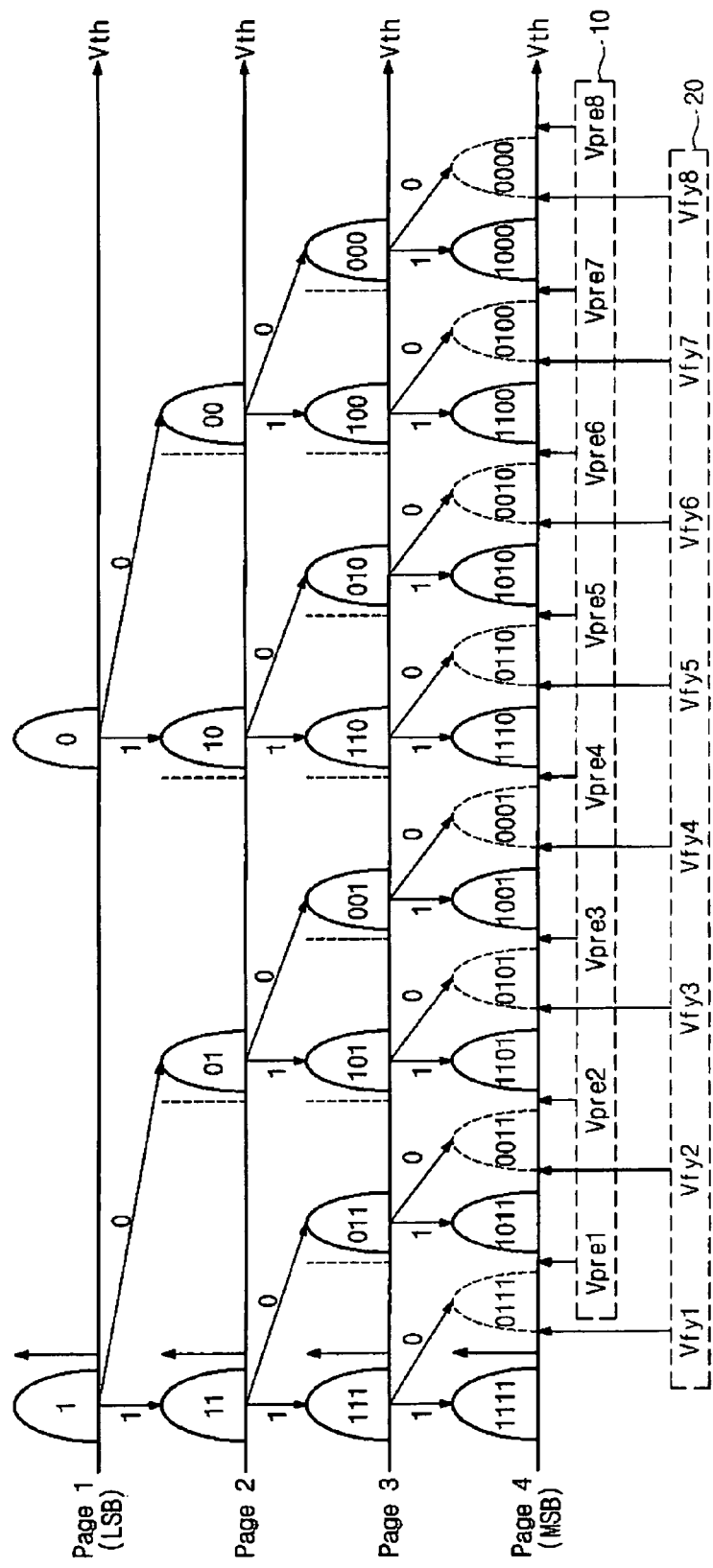
FIG. 1 is a view of conventional processes of programming multi bit data by a page unit according to a binary ordering method.
Figure 2:
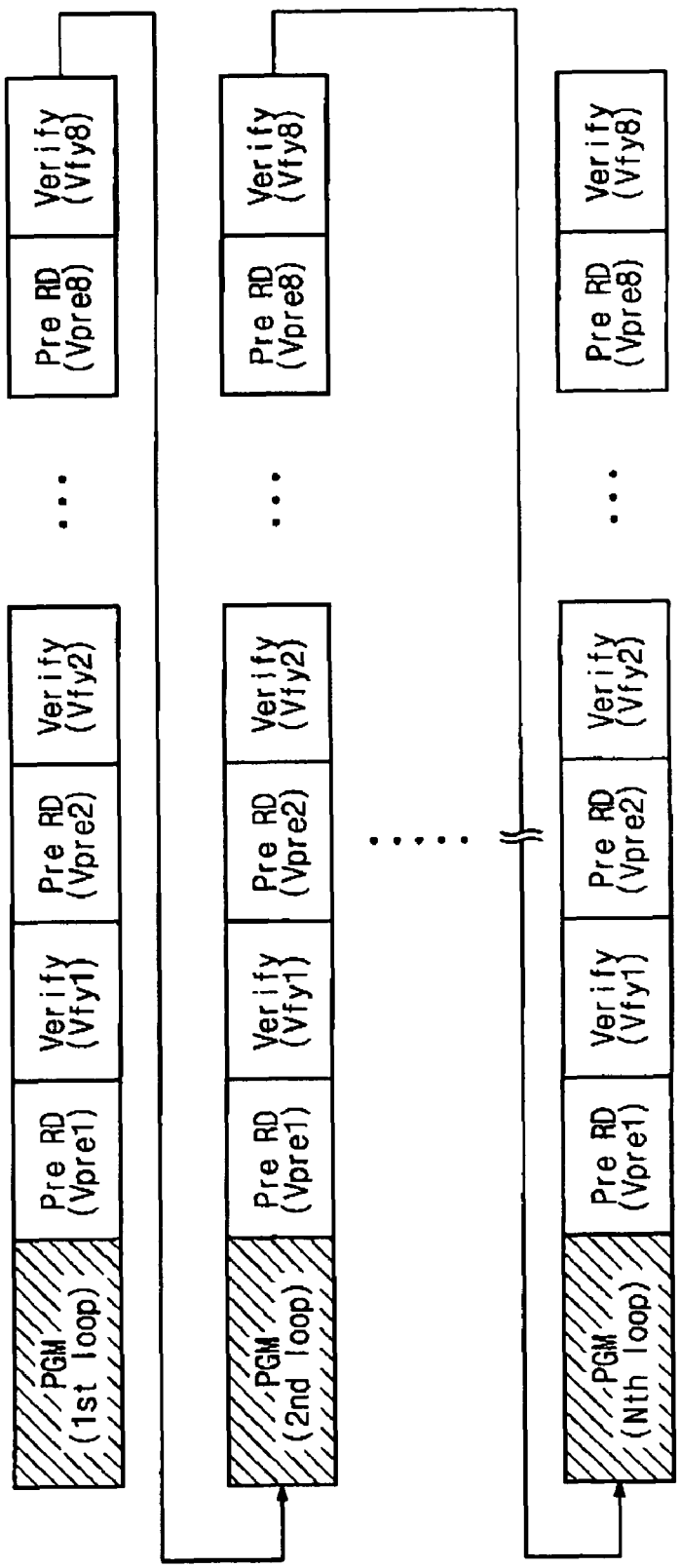
FIG. 2 is an example timing diagram of a program operation according to the sequence in FIG. 1.
Figure 3:
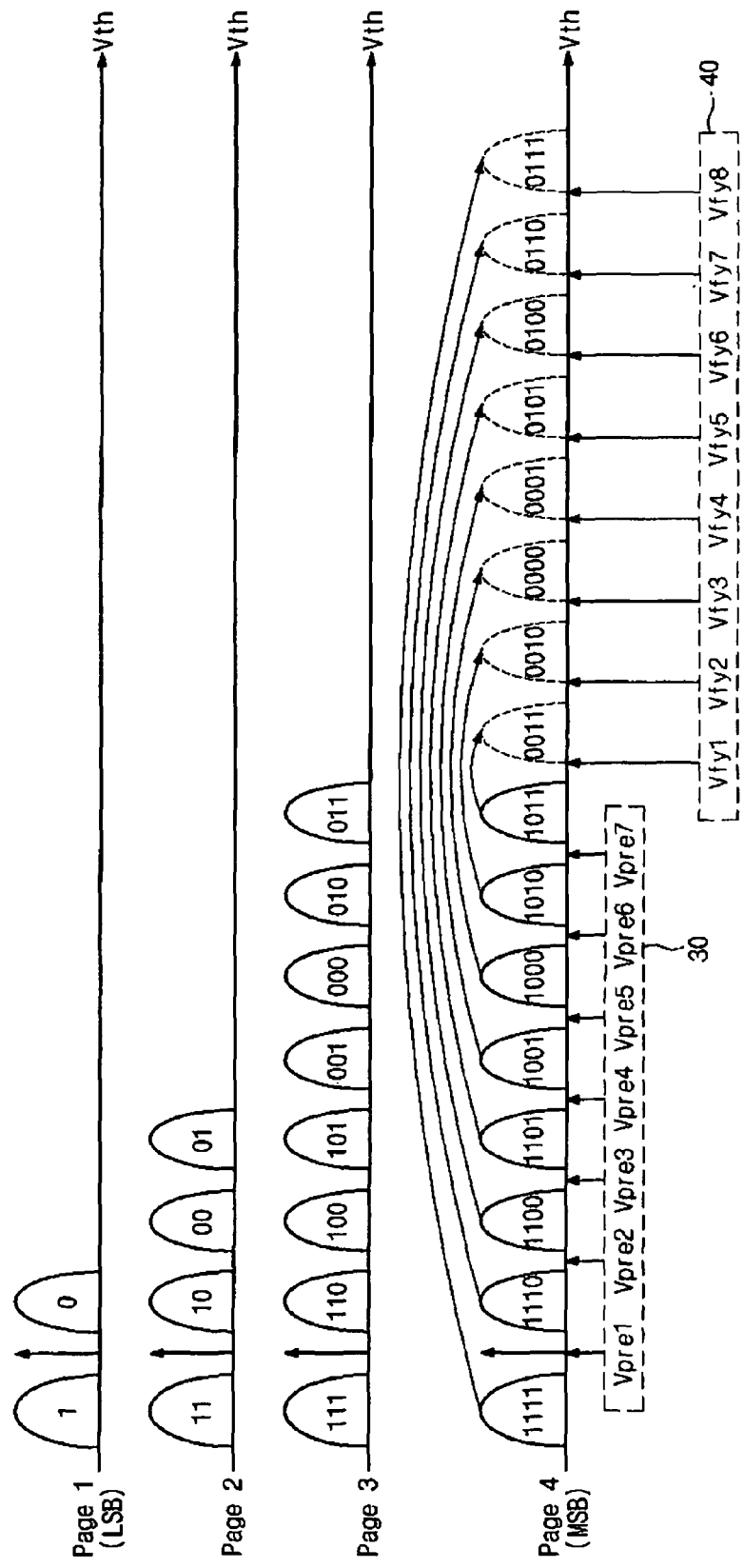
FIG. 3 is a view of conventional processes of programming multi bit data by a page unit according to a gray ordering method.
Figure 4:
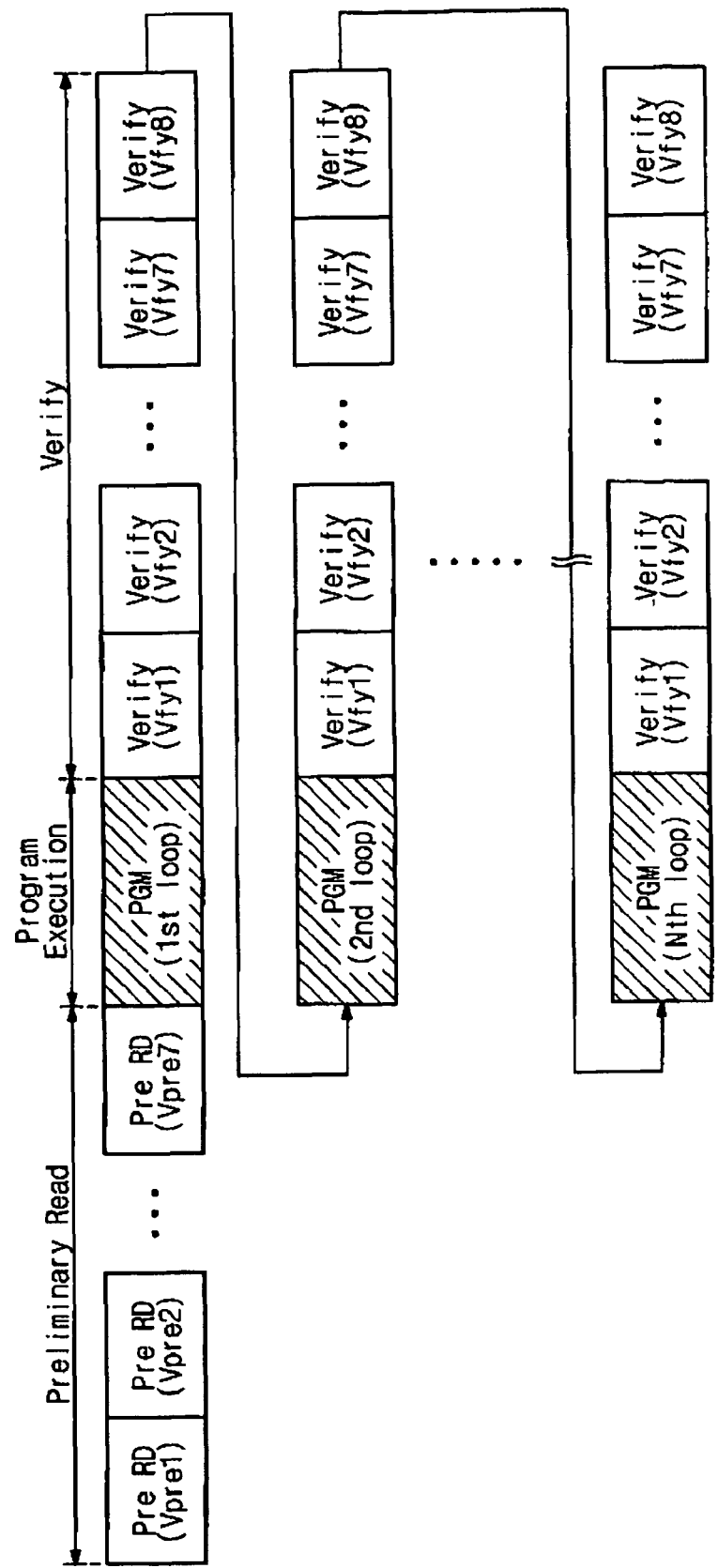
FIG. 4 is an example timing diagram of a program operation according to the sequence in FIG. 3.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 5:
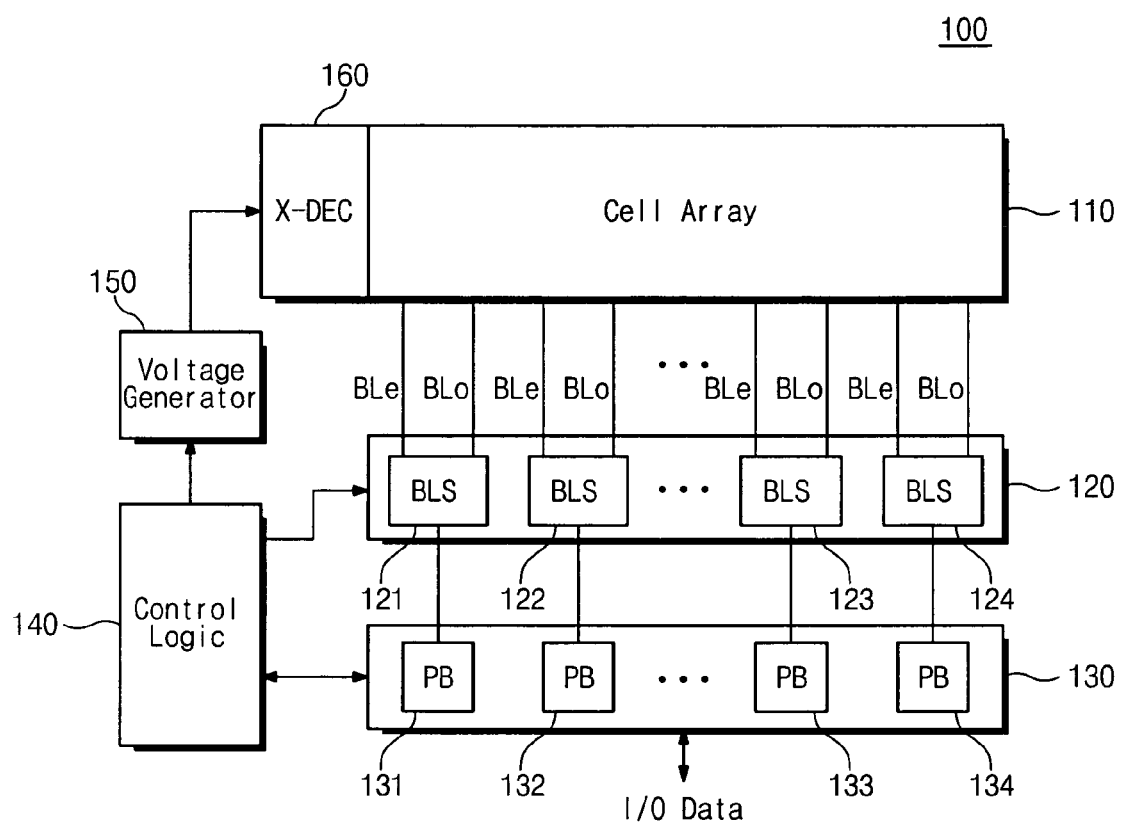
FIG. 5 is a block diagram of a flash memory device configured to program multi bit data according to a programming method of example embodiments.

FIG. 5 is a block diagram of a flash memory device configured to program multi bit data according to a programming method of example embodiments. Referring to FIG. 5, during a program operation, a multi bit flash memory device 100 of example embodiments may divide selected memory cells into a plurality of groups according to a threshold voltage state. The divided memory cells may be programmed by a group unit.

The multi bit flash memory device 100 may include a cell array 110, a bit line select circuit 120, a page buffer 130, a control logic 140, a voltage generator 150, and/or a row decoder 160. The bit line select circuit 120 may include a plurality of bit lines selects BLS 121, 122, ..., 123, and 124. The page buffer block may include a plurality of page buffers PB 131, 132, ..., 133, 134.

The cell array 110 may include multi bit flash memory cells, each of which may store 4-bit or more data. The multi bit flash memory cells may be programmed through one of a plurality of threshold voltage states in order to store a plurality of bit data in one cell. The memory cells in the cell array 110 may receive a program voltage Vpgm, first read voltages Vpre1 to Vpre7, and/or second read voltages Vfy1 to Vfy8 through a word line. If applying the program voltage Vpgm to the memory cells in the memory cell array 110, page data supplied through the bit line may be programmed, e.g., simultaneously programmed, from the page buffer block 130. The page data programmed into the memory cells may be detected by the page buffer block 130.

The bit line select circuit 120 may selectively deliver a bit line voltage supplied from the page buffer 130 into one of an even bit line BLe and an odd bit line BLo in response to control from the control logic 140.

The page buffer block 130 may operate as a write driver or a detect amplifier according to an operation mode. For example, the page buffer block 130 may operate as a detect amplifier during a preliminary read operation, and/or operate as a write driver during a program execution operation. The page buffer block 130 may perform a preliminary read operation according to control from the control logic 140, in order to read a programmed state of a memory cell. The programmed states of the memory cells may be sequentially programmed according to the first read voltages Vpre1 to Vpre7 in order to latch the read data.

During a program operation, the page buffer block 130 of an example embodiment may latch inputted program data I/O data by a page unit. The program data of the latched page unit may transfer to the bit line of the cell array 110 for programming. However, the page buffer block 130 of an example embodiment need not simultaneously deliver loaded program data into the bit line. The page buffer block 130 may deliver the program data, which is loaded into each page buffer PB, into each bit line by a group unit that is selected using the control logic 140. Accordingly, bit lines of the page buffers PB in an unselected group may be biased to a bit line voltage (e.g., Vcc) for program inhibit. For example, during a program operation, the data loaded in the page buffer PB may be delivered into the bit line of the memory cells in the first group. However, a bit line voltage (e.g., Vcc) for program inhibit may be delivered into the bit lines corresponding to the remaining memory cells which are not part of the selected group.

The control logic 140 may activate or deactivate each page buffer PB according to the group of the divided memory cells selected during a program operation. For example, the control logic 140 may control the bit line to deliver the data loaded in the page buffer into the bit lines, which are connected to the memory cells of the selected group. The control logic 140 may control the page buffer block 130 to apply the bit line voltage (e.g., Vcc) corresponding to the program inhibit into the bit lines, which are connected to the memory cells in the unselected group or groups. The control logic 140 may control, e.g., simultaneously control, a voltage generator 150 to apply the program voltage Vpgm into the word line. During a preliminary read operation or a verify read operation, the control logic 140 may control the voltage generator 150 to apply the first read voltages Vpre1 to Vpre7 or the second read voltages Vfy1 to Vfy8 into the word lines. The control logic 140 may control, e.g., simultaneously control, the page buffer block 130 to detect the data of the memory cell provided into the bit line in response to the first read voltages Vpre1 to Vpre7 or the second read voltages Vfy1 to Vfy8.

The voltage generator 150 may generate a voltage corresponding to each mode in response to control of the control logic 140. During a program execution operation, the voltage generator 150 may apply the program voltage into the word line of the memory cells. During a preliminary read operation, the first read voltages Vpre1 to Vpre7 may be sequentially generated to be applied to the selected word lines. During a verify read operation, the second read voltages Vfy1 to Vfy8 may be generated to be sequentially applied to the word lines connected to the selected memory cells. A row decoder 160 may supply a word line voltage, which is generated by the voltage generator 150, into the selected word line in response to a row address (not shown).

The multi bit flash memory device of an example embodiment may activate only page buffers corresponding to the memory cells of the selected group for the inputted page data. For example, the control logic 140 may control the page buffer block 130 to deliver the bit line voltage corresponding to the program data into the bit lines which are connected to the page buffer or buffers PB in the selected group. The control logic 140 may control the page buffer block 130 to apply a bit line voltage (e.g., Vcc) for program inhibit into the bit lines which are connected the page buffer or buffers PB of the unselected group or groups. A select operation of the group units in the memory cells may repeat until the inputted program data is programmed into each corresponding memory cell. Although the operation of deactivating the bit lines, which correspond to the memory cells of the unselected group or groups, is performed in the buffer block 130 by the control logic 140, example embodiments are not limited to the above deactivate operation. For example, the bit lines corresponding to the memory cells in the unselected group or groups may be biased to the bit line voltage (e.g., Vcc) for program inhibit in a bit line switch 120 according to control of the control logic 140.

Figure 6:
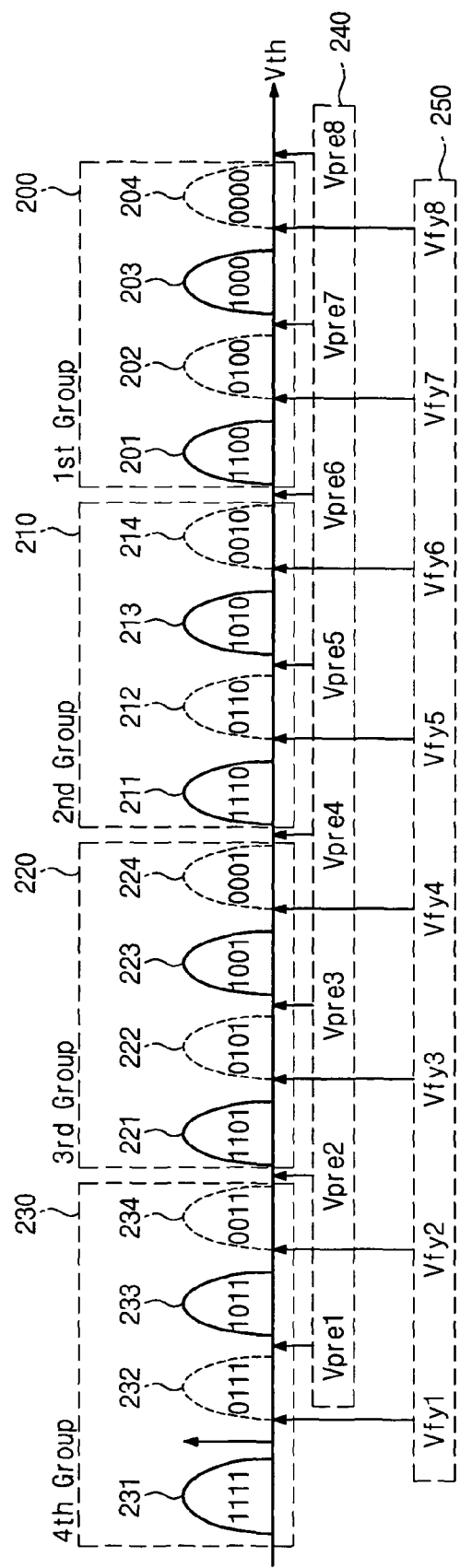
FIG. 6 is a view of a programming method according to a binary ordering method of example embodiments.

FIG. 6 is a view of a programming method according to a binary ordering method. Referring to FIG. 6, a group dividing method of memory cells is described, in which the program data is assigned to a threshold voltage state through a binary ordering method. The memory cells may be divided into the four groups 200, 210, 220, and 230 for programming a fourth page, and may include threshold voltage states 201-204, 211-214, 221-224, and 231-234. The threshold voltage states may be verified by first threshold voltages 240 and second threshold voltages 250.

A first group 200 may include memory cells programmed in threshold voltage states 100 and 000 according to the programming result of the third page. The memory cells in the threshold voltage state 100 may be programmed with a threshold voltage state 202 corresponding to data 0100 if the fourth page data is 0. The memory cells in the threshold voltage 000 may be programmed into the threshold voltage state 204 corresponding to the data 0000 if the fourth page data is 0. The fourth page program operation of the memory cells in a first group 200 may be as follows. Only the memory cells in the first group 200 may be selected and a program voltage Vpgm may be applied to the memory cells in the first group 200. A preliminary read operation may be performed by the first read voltage Vpre7. After the preliminary read operation, a verify read operation may be performed by the second read voltage Vfy7. A determination of whether data 0100 of the memory cells corresponding to the threshold voltage state 201 is programmed or not. If the threshold voltage state of the memory cells, where the fourth page data is 0, exist between the second read voltage Vfy7 and the first read voltage Vpre7, a pass may be determined, and 1 is loaded into the corresponding page buffer PB. However, if the threshold voltage state of the memory cells, where the fourth page data is 0, does not exist between the second read voltage Vfy7 and the first read voltage Vpre7, a fail may be determined. Accordingly, 0 may be loaded into the corresponding page buffer PB for a reprogram operation. A verify operation may be performed to determine if the data 0000 of the memory cells corresponding to the threshold voltage state 204 is programmed or not. If the threshold voltage state of the memory cells, where the fourth page data is 0, exist between the second read voltage Vfy8 and the first read voltage Vpre8, a pass may be determined and/or 1 may be loaded into the corresponding page buffer PB. However, if the threshold voltage state of the memory cells, where the fourth page data is 0, does not exist between the second read voltage Vfy8 and the first read voltage Vpre8, a fail may be determined. Accordingly, 0 may be loaded into the corresponding page buffer PB for a reprogram operation.

If the verify operation of the memory cells in the first group 200 is finished, program execution and verify operations may be performed on the memory cells in a second group 210. After the program execution operation, the memory cells 211 and 213 in the second group 210 may be verified using the first read voltage Vpre5 and the second read voltage Vfy5, and/or the first read voltage Vpre6 and the second read voltage Vfy6. The memory cells in a third group 220 may be programmed using the program execution operation, and/or may be verified using the preliminary and second read voltages Vpre3, Vfy3, Vpre4, and Vfy4. The memory cells in a fourth group 230 may be programmed using the program execution operation, and/or may be verified using the preliminary and second read voltages Vpre1, Vfy1, Vpre2, and Vfy2. If the program loops of all the selected memory cells in a selected group are finished, the next program loop may continue in order to reprogram the memory cells that may be determined as fail through the previous verify operation. The next program loop may include a program execution duration if a program voltage is applied, and/or a verify duration where the verify operation may be performed by the first and second read voltages. The program loops may continue until the selected memory cells are determined as program pass. The program loop for reprogramming may use methods and sequences identical to those of the first program loop.

Figure 7:
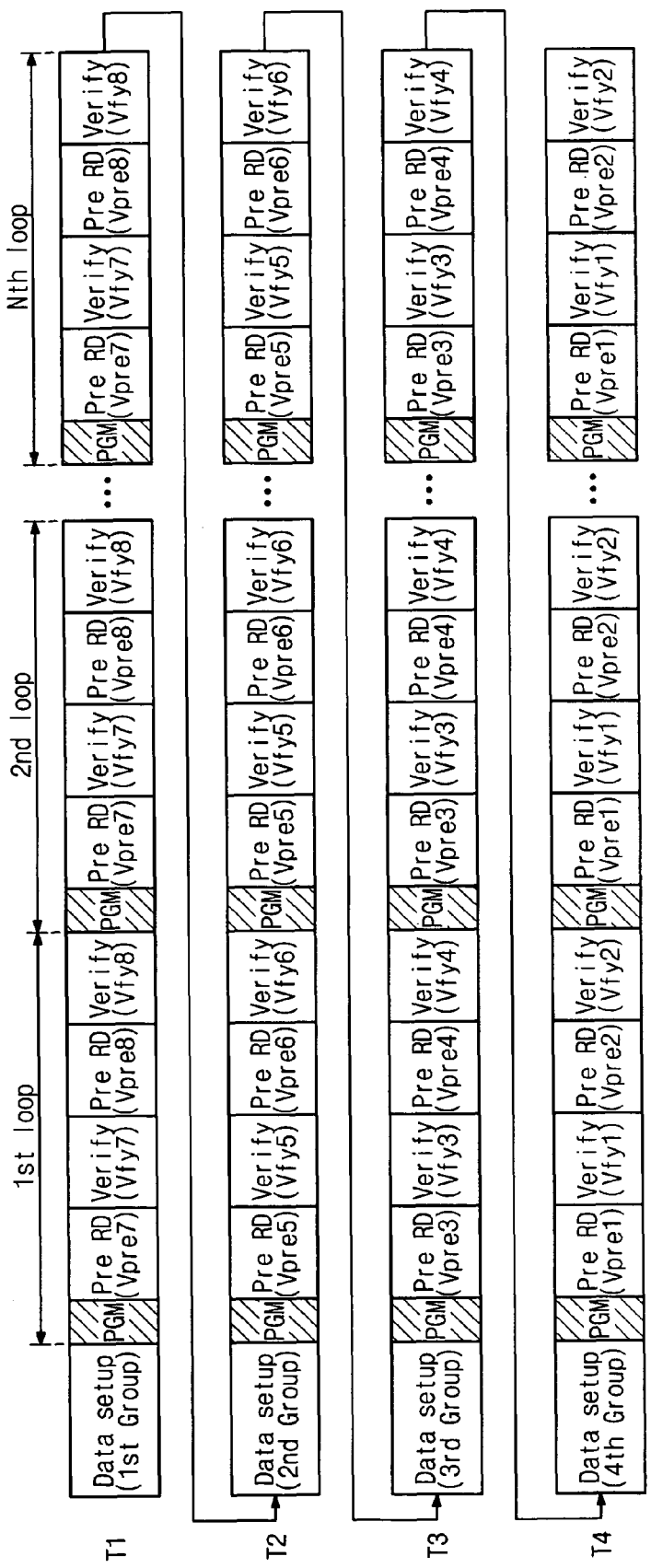
FIG. 7 is an example timing diagram of a program operation according to a classification of FIG. 6.

FIG. 7 is an example timing diagram of a program operation according to the classification of FIG. 6. Referring to FIG. 7, a time for programming may be divided into four intervals T1 to T4 during which the memory cells of each group may be programmed.

The memory cells in the first group 200 may be programmed in the interval T1. The interval T1 may start from a data setup interval that selects only the memory cells in the first group. During the data setup interval, the program data corresponding to the forth page may be respectively loaded into the corresponding page buffers PB. Only the bit lines of the page buffer or buffers PB corresponding to the first group 200 may be activated. The bit lines of the page buffer or buffers PB corresponding to the second through fourth groups 210, 220, and 230 may be biased to the bit line voltage (e.g., Vcc) for program inhibit. If the setup of the data is completed, the control logic 140 may apply the program voltage into the word line in order to start a first loop operation that may program the memory cells corresponding to the first group 200. If the program execution operation PGM applying a program voltage into a word line is completed, the control logic 140 may perform a verify operation on the memory cells of the first group 200. The verify operation may be performed on the memory cells programmed in the threshold voltage state 0100, and/or the memory cells programmed in the threshold voltage state 0000. The threshold voltage 0100 may be verified by the first read voltage Vpre7 and the second read voltage Vfy7. If a threshold voltage of the memory cells exists between the first read voltage Vpre7 and the second read voltage Vfy7, a pass may be determined. The memory cell determined as a pass may become program inhibit in the next reprogramming loop $2^{nd}$ loop-$N^{th}$ loop. The threshold voltage state 0000 may be verified by the first read voltage Vpre8 and the second read voltage Vfy8. If a threshold voltage of the memory cells programmed by the program voltage of the first loop exists between the first read voltage Vpre8 and the second read voltage Vfy8, a pass may be determined. The memory cells determined as pass become program inhibit in the next reprogram loop $2^{nd}$ loop to $N^{th}$ loop. The memory cells determined as fail in the verify operation may be selected for reprogramming in the reprogram loop $2^{nd}$ loop to $N^{th}$ loop. A program voltage applied in the reprogram loop $2^{nd}$ loop to $N^{th}$ loop may use an incremental step pulse program (ISPP) method. The program execution operation PGM and the verify operation through the first read voltages Vpre7 and Vpre8, and the second read voltage Vfy7 and Vfy8 may continue until all the memory cells in the first group 200 are determined as pass.

If the program operation of the first group 200 is completed, the program and verify operations may be performed on the memory cells of the second group 210 in the interval T2. The interval T2 may start from a data setup operation that selects only the memory cells of the second group 210 and changes the remainder of the memory cells, i.e., the memory cells in the unselected groups, to program inhibit. During the data setup operation, a bit line voltage (e.g., Vcc) for program inhibit may be loaded into the bit lines corresponding to the unselected memory cells. If the data setup operation is completed, a first program loop may be performed on the memory cells of the second group 210. The first program loop may include a program execution operation PGM to which a program voltage is applied and/or a verify operation following the program execution operation PGM. During the program execution operation, a bit line voltage corresponding to a program data may be applied to the bit line of the selected memory cells, and/or a bit line voltage (e.g., Vcc) for program inhibit may be applied to the bit lines of all the unselected memory cells. The verify operation may be performed on the threshold voltage state 0110 and the threshold voltage state 0010. The threshold voltage state 0110 may be verified by the first read voltage Vpre5 and the second read voltage Vfy5. If a threshold voltage of the memory cells programmed by the first loop exists between the first read voltage Vpre5 and the second read voltage Vfy5, a pass may be determined. The memory cells determined as pass become program inhibit in the next reprogramming loop $2^{nd}$ loop to $N^{th}$ loop. The threshold voltage state 0010 may be verified by the first read voltage Vpre6 and the second read voltage Vfy6. If a threshold voltage of the memory cells programmed by the program voltage of the first loop exists between the first read voltage Vpre6 and the second read voltage Vfy6, a pass may be determined. The memory cells determined as fail, e.g., if a threshold voltage does not exist between the first read voltage and the second read voltage in the verify operation may be programmed and verified using an ISPP method in the second loop for reprogramming.

The memory cells in the third and fourth groups 220 and 230 may be programmed into target threshold voltage states by program execution and verify operations identical to those of the first and second groups 200 and 210.

An example embodiment may provide a method of storing multi bit data programmed through a binary ordering method. According to a programming method of an example embodiment, the memory cells may not be simultaneously programmed with a target threshold voltage in order to program one page data. Instead, the programming method of an example embodiment may divide the memory cells into a plurality of groups, and/or program the memory cells by each group unit. Accordingly, because a preliminary read operation is performed on the divided groups, each page buffer PB may only store 1-bit preliminary read data. Accordingly, chip size may be more reduced, compared to a conventional programming method that stores a 3-bit preliminary read result.

Figure 8:
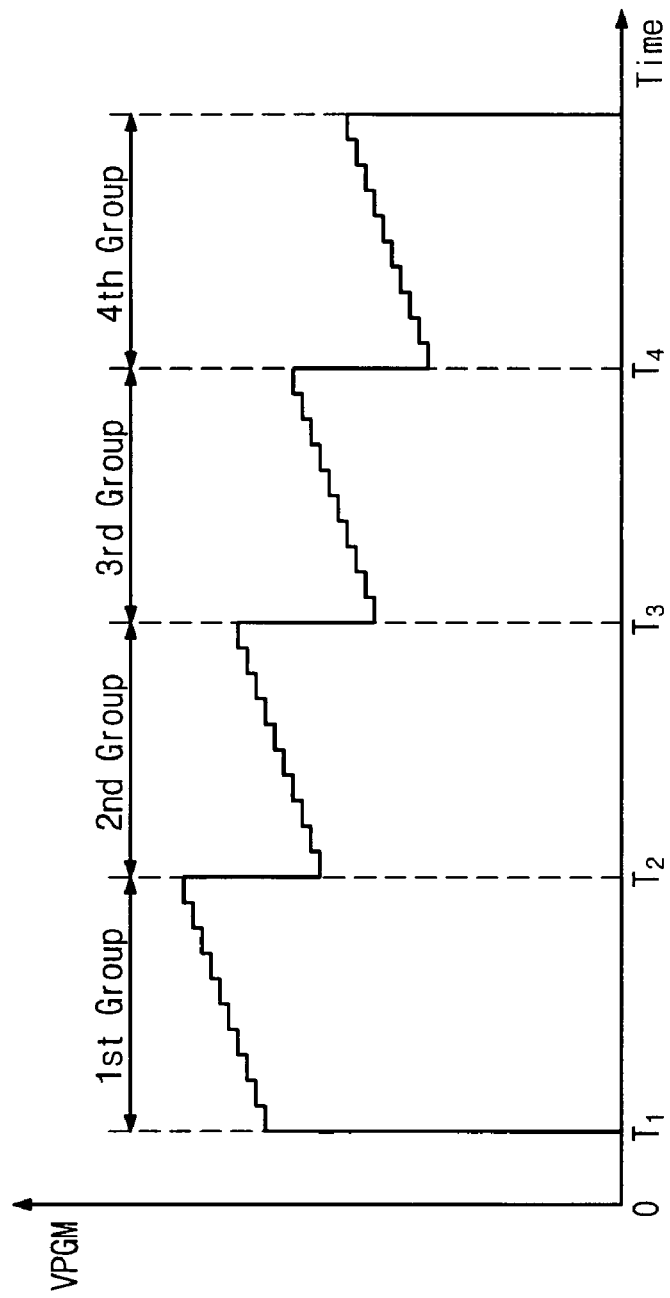
FIG. 8 is an example waveform diagram of a program voltage applied to each program interval in FIG. 7.

FIG. 8 is an example waveform diagram of a program voltage applied to each program interval in FIG. 7. Referring to FIG. 8, a step voltage may be supplied to the memory cells corresponding to each divided group in order to provide pulses of increased step size as the loop increases. However, after programming the third page data, threshold voltage states of the memory cells in each group may be different from each other. The memory cells in the first group 200 may be programmed with a higher threshold voltage than the memory cells of the second group 200. Accordingly, if performing a program operation on each group, a program start voltage may not be the same. A program start voltage for programming the memory cells in the first group 200, where the threshold voltage state 100 or 000 may be programmed, may be higher than a program start voltage of the second group 210. The program start voltage of the second group 210 may be higher than a program start voltage of the third group 220. The program start voltage of the third group 220 may be higher than a program start voltage of the fourth group 230. For example, the memory cells in the first group 200 with a higher threshold voltage may be programmed first to improve a program disturb property, which may be caused due to coupling effect between adjacent memory cells. The memory cells that are programmed in a relatively higher threshold voltage state may have lower stress than the memory cells that are programmed in a relatively lower threshold voltage state.

According to the programming method of an example embodiment in which a group (e.g., a first group) programmed with a higher threshold voltage is programmed first with a higher program start voltage, expansion of the threshold voltage state may be reduced after programming. Accordingly, a more reliable read operation in a multi bit flash memory device with an insufficient reading margin may be obtained.

Figure 9:
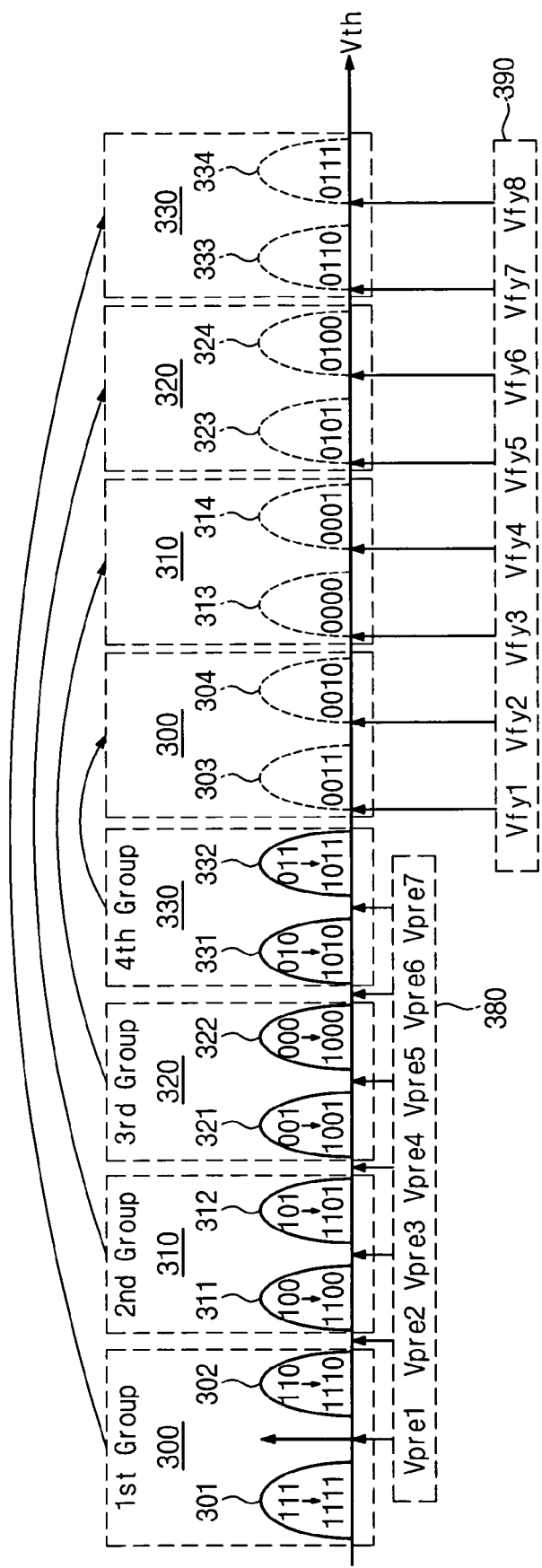
FIG. 9 is a view of a programming method according to a gray ordering method of example embodiments.

FIG. 9 is a view of a programming method according to a gray ordering method. Referring to FIG. 9, a method of dividing memory cells into a group by a threshold voltage state according to a gray ordering method is described as an example. The memory cells may be divided into four groups 300, 310, 320, and 330 for programming a fourth page, and may include threshold voltage states 301-304, 311-314, 321-324, and 331-334. The threshold voltage states may be verified by at least a portion of first threshold voltages 380 and second threshold voltages 390.

A first group 300 may include memory cells programmed with threshold voltage states 111 and 110 according to the program result of the third page. The memory cells in the threshold voltage state 111 may become program inhibit in a case if a fourth page data is 1 in order to maintain a threshold voltage state 301 corresponding to data 1111. The memory cells in the threshold voltage state 110 may maintain a threshold voltage state 302 corresponding to data 1110 in a case of when the fourth page data is 1.

If the fourth page data programmed into the memory cells of the first group 300 is 0, a program operation may be as follows. Only the memory cells in the first group 300 may be selected and the remainder of the memory cells may be set to program inhibit. A preliminary read operation may be performed by a first read voltage Vpre1. A program voltage may be applied to and verified in the memory cells, which are read as 111, through the first read voltage Vpre1, in order to program the memory cells in a threshold voltage state 0111. A program voltage may be applied to and verified in the memory cells, which are read as 110, through the first read voltage Vpre1, to program the memory cells in a threshold voltage state 0110. During the program execution operation PGM, a program data may be loaded into a page buffer, and a program voltage Vpgm may be applied to the word line of the memory cells. During a verify operation, whether the memory cells, which are read as the threshold voltage state 110 by the preliminary read operation, are successfully programmed into a threshold voltage state 0110 or not is detected by a second read voltage Vfy7. Whether the memory cells, which are read as the threshold voltage state 111 by the preliminary read operation, are successfully programmed into a threshold voltage state 0111 or not is detected through a second read voltage Vfy8. The program operation for the first group 300 may include a single preliminary read operation and a plurality of following program loops. The plurality of following program loops may repeat until the memory cells of the first group 300 are programmed into a target threshold voltage state.

The memory cells in a second group 310 may be selected for a program operation during a data setup operation. A single preliminary read operation may be performed on the selected memory cells of the second group 310 by the first read voltage Vpre3. After the preliminary read operation, program loops including a program execution operation for the memory cells in the second group 310 and a verify operation using the second read voltages Vfy5 and Vfy6 may repeat. During a verify operation, whether a threshold voltage state 101 of the memory cells read by the first read operation is programmed into a threshold voltage state 0101 or not is verified by a second read voltage Vfy5. Until all the memory cells in the second group are determined as pass, the program execution operation PGM, using an increased program voltage and a verify operation for the second voltages Vfy5 and Vfy6, may repeat.

The memory cells in a third group 320 and a fourth group 330 may be programmed and verified using the same method as the memory cells of the second group 310. However, a preliminary read operation, which is performed before a program loop, may be performed on the memory cells of the third group 320 by using the first read voltage Vpre5 and on the memory cells of the fourth group 330 by using the first read voltage Vpre7.

Figure 10:
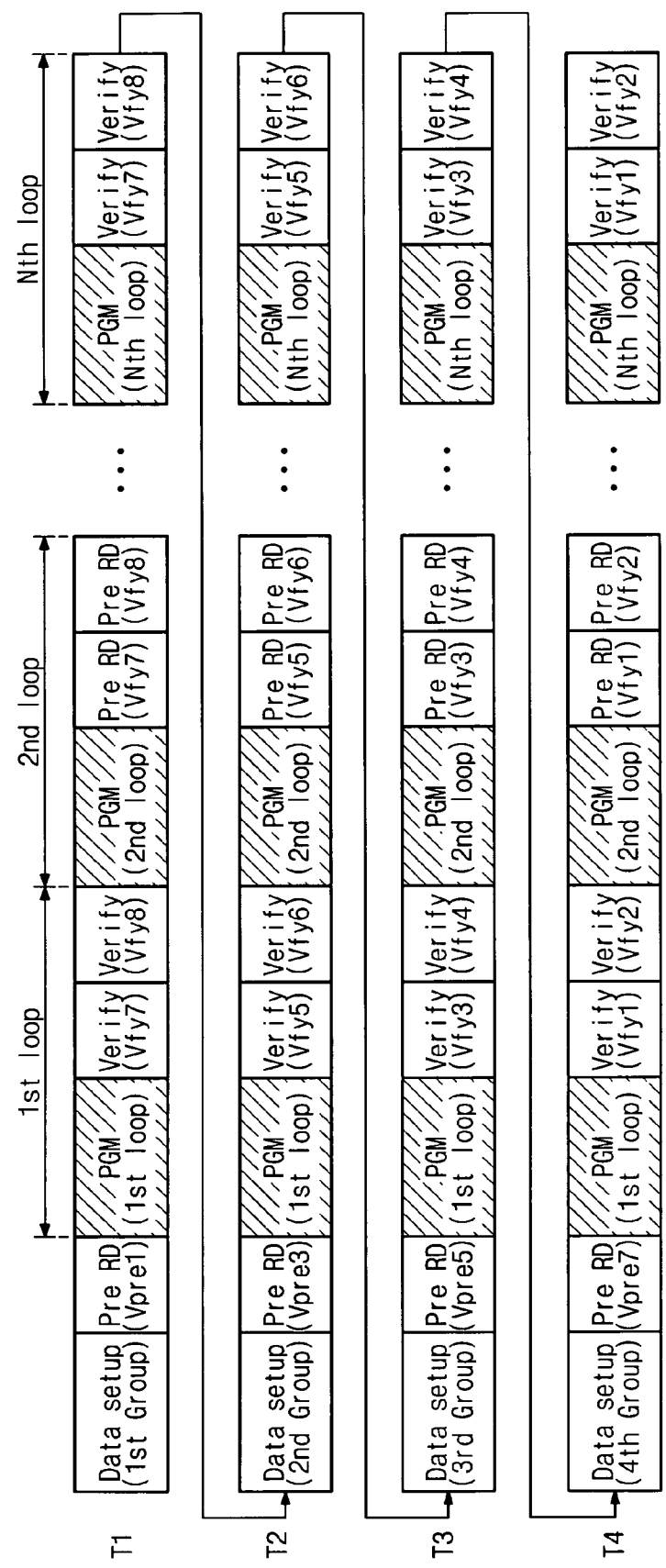
FIG. 10 is an example timing diagram of a program operation according to a classification of FIG. 9.

FIG. 10 is an example timing diagram of a program operation according to the classification of FIG. 9. Referring to FIG. 10, a program time may be divided into four intervals T1 to T4 where the memory cells included in the respective four groups may be programmed.

In the interval T1, the memory cells in the first group 300 of FIG. 9 may be programmed. The interval T1 may start from a data setup interval that selects only the memory cells in the first group 300. Before the data setup interval, the fourth page data may already be loaded into the page buffers PB. Accordingly, during the data setup interval, the bit lines corresponding to the selected first group 300 may be set to deliver the loaded data in the corresponding page buffer or buffer PB. However, a bit line bias operation for program inhibit may be performed on the bit lines corresponding to the remaining second, third, and fourth groups 310, 320, and 330.

Unlike the binary ordering method described above, only one preliminary read operation may be performed after the data setup interval in the multi bit flash memory device, where program data is programmed using a gray ordering method. A preliminary read operation Pre RD may be performed on the memory cells of the first group 300 selected in the data setup interval by using a first read voltage Vpre1. A threshold voltage state of the memory cells in the first group may be read by the preliminary read Pre RD operation, and/or a read threshold voltage state may be used as a reference during a verify operation. According to the preliminary read Pre RD operation, a first program loop $1^{st}$ loop may be performed, which includes a program execution operation to which a program voltage is applied, and a verify operation using the second read voltages Vfy7 and Vfy8 to verify the memory cells that are programmed. During the verify operation, setting may be performed on the page buffer or buffers PB corresponding to the memory cells that are determined as pass for program inhibit in the next program loop. However, the previously loaded page data may be maintained in the page buffer or buffers PB of the memory cells determined as fail. A second program loop $2^{nd}$ loop may be performed to program the memory cells determined as fail in the first program loop $1^{st}$ loop, with a more increased program voltage than the first program loop. The program loops may repeat until all of the memory cells in the first group 300 are determined as pass.

If the program operation on the first group is completed, an interval T2 may proceed in order to program and perform a verify operation on the memory cells in the second group 310. In each of intervals T2 to T4, one preliminary read operation Pre RD described in the interval T1 and program loop repeating until all the selected memory cells are completely programmed may be performed.

An example embodiment may provide a programming method of a multi bit flash memory device in which program data is programmed using a gray ordering method. According to the programming method of multi bit data, memory cells may be divided into a plurality of groups according to a threshold voltage state generated by the program operation of the third page. The fourth page data may be programmed by each group unit of the memory cells. An operation of programming each group may include a data setup operation activating only the selected group, a one time preliminary read operation, and/or a plurality of program loops repeating a program execution and a verify operation. As described above, because the one time preliminary read operation may be performed on only the selected group, a page buffer may include one latch for storing the preliminary read result of 1-bit, and/or one latch for storing the program data. Accordingly, the page buffer programs multi bit data with only two latches.

As described above, an example embodiment may provide a group dividing method of a memory cell in which eight threshold voltage distributions, after programming the third page, may be divided into four respective groups including two threshold voltage distributions. However, the group dividing method of an example embodiment is not limited thereto. For example, the eight threshold voltage distributions may be divided into two respective groups including four threshold voltage distributions. One divided group may include memory cells corresponding to one threshold voltage distribution.

According to example embodiments there may be respectively different advantages according to the arrangement methods. In the multi bit flash memory device using a binary ordering method according to an example embodiment, a preliminary read operation and verify read operations may be performed on only memory cells of the selected group. Accordingly, an overall program speed for programming multi bit data may increase. On the other hand, in the multi bit flash memory device using a gray ordering method according to example embodiments, only one preliminary operation may be necessary for each group. For one preliminary read operation, an operation for storing the size of 1 bit may be required, such that only two latches in a page buffer may be sufficient. Accordingly, the number of latches in a page buffer may be drastically reduced.

Figure 11:
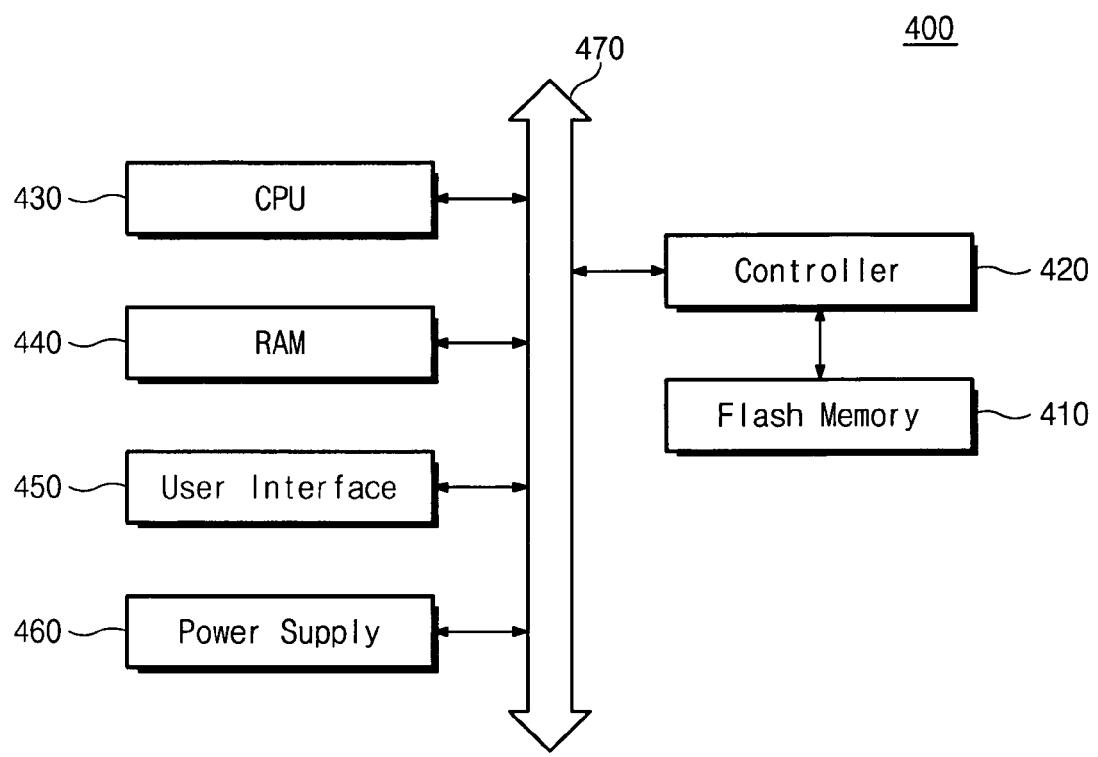
FIG. 11 is a block diagram of a system including a multi bit flash memory device according to an example embodiment.

FIG. 11 is a block diagram of a system 400 including a multi bit flash memory device 410 according to an example embodiment. Referring to FIG. 11, a multi bit flash memory device 410 according to an example embodiment may be mounted on the system 400. For example, the system 400 may be a mobile device or a desktop computer. The system 400 may include a CPU 430, a RAM 440, a user interface 450, a power 460, a memory controller 420, and/or the multi-bit flash memory device 410, which may be electrically connected to each other through a bus 470. The multi bit flash memory device 410 may store data that are provided through the user interface 340, and/or data that are processed by the CPU 430 and delivered by the memory controller 420. The multi bit flash memory device 410 and the memory controller 420 are described as separately configured, however, example embodiments are not limited thereto and the memory controller 420 may be included in the multi bit flash memory device 410. Although not illustrated in the drawings, a computing system according to example embodiments may further include an application chipset, a camera image processor, etc.

According to an example embodiment, there is a provided programming method capable of increasing a program speed of a multi bit flash memory device. A programming method according to an example embodiment may reduce the number of latches in a page buffer, which may be required during a program operation of a multi bit flash memory device.

Although example embodiments have been shown and described in this specification and figures, it would be appreciated by those skilled in the art that changes may be made to the illustrated and/or described example embodiments without departing from their principles and spirit.

What is claimed is:

1. A method of programming a flash memory device, the method comprising:
    dividing a plurality of memory cells into a plurality of groups according to a threshold voltage states of each of the plurality of memory cells, the memory cells configured to store multi bit data; and
    programming the plurality of memory cells with a program data over a plurality of sequential time periods, each of the plurality of sequential time periods corresponding to one of the divided groups,
    wherein the programming is performed such that, for each of the plurality of sequential time periods, the memory cells of the divided group corresponding to the sequential time period are selected and programmed during the sequential time period.

2. The method of claim 1, wherein the plurality of memory cells are flash memory cells configured to store 4-bit data corresponding to first through fourth pages.

3. The method of claim 2, wherein the program data is fourth page data.

4. The method of claim 3, wherein each group of the plurality of groups includes memory cells with one threshold voltage state.

5. The method of claim 3, wherein each group of the plurality of groups includes memory cells with at least two different threshold voltage states.

6. The method of claim 5, wherein programming the plurality of memory cells with the program data comprises,
selecting the memory cells of a selected group;
applying the program data to a bit line of the selected memory cells and a program voltage to a word line of the plurality of memory cells; and
verifying if the selected memory cells are programmed.

7. The method of claim 6, wherein the plurality of memory cells except for the selected memory cells are program inhibit during the programming the plurality of memory cells with the program data.

8. The method of claim 6, wherein the applying and verifying steps constitute one program loop, and the one program loop repeats until all of the selected memory cells of the selected group are programmed to target threshold voltage states.

9. The method of claim 6, wherein the selecting step comprises selecting and programming memory cells of a higher threshold voltage before programming memory cells of a lower threshold voltage.

10. The method of claim 9, wherein the plurality of groups are respectively programmed with different program start voltages.

11. The method of claim 10, wherein a program start voltage of a group with a relatively higher threshold voltage state is higher than a program start voltage of a group with a lower threshold voltage state.

12. The method of claim 6, wherein verifying if the selected memory cells are programmed comprises detecting if threshold voltages of the selected memory cells exist in a range between an upper limit and a lower limit of a target threshold voltage state.

13. The method of claim 12, wherein the detecting if the threshold voltages of the selected memory cells exist in the range between the upper limit and the lower limit of the target threshold voltage state is performed on each of the threshold voltage states in the group.

14. The method of claim 5, wherein programming the plurality of memory cells with the program data comprises,
selecting the memory cells of a selected group;
performing a first read operation to read a threshold voltage state of the selected memory cells;
applying a program voltage to a word line of the selected memory cells; and
verifying if the memory cells of the selected group are programmed.

15. The method of claim 14, wherein the plurality of memory cells except for the selected memory cells are program inhibit during the programming the plurality of memory cells with the program data.

16. The method of claim 14, wherein the performing the first read operation comprises detecting if a threshold voltage of the selected memory cells is included in one of the at least two threshold voltage states and storing the detected result as data.

17. The method of claim 16, wherein the first read operation is performed once if the number of threshold voltage states in the selected group is two.

18. The method of claim 17, wherein if the number of threshold voltage states in the selected group is two, the verifying if the memory cells of the selected group are programmed comprises performing a verify read operation twice with respectively different verify voltages on another two threshold voltage states programmed from the two threshold voltage states.

19. The method of claim 16, wherein if the number of threshold voltage states in the selected group is four, the first read operation is performed three times.

20. The method of claim 14, wherein the applying and the verifying steps repeat until all of the selected memory cells of the selected group are programmed to target threshold voltage states.

21. The method of claim 1, wherein the program data is a most significant bit (MSB) page data of the multi bit data.

* * * * *